United States Patent
Lee et al.

(10) Patent No.: US 8,969,979 B2
(45) Date of Patent: Mar. 3, 2015

(54) MEMS DEVICES

(71) Applicant: Taiwan Semiconductor Manufacturing Company, Ltd., Hsin-Chu (TW)

(72) Inventors: Te-Hao Lee, Taipei (TW); Yuan-Chih Hsieh, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/132,328

(22) Filed: Dec. 18, 2013

(65) Prior Publication Data

US 2014/0103462 A1    Apr. 17, 2014

Related U.S. Application Data

(62) Division of application No. 13/310,422, filed on Dec. 2, 2011, now Pat. No. 8,623,768.

(51) Int. Cl.
| | |
|---|---|
| *H01L 29/84* | (2006.01) |
| *B81B 3/00* | (2006.01) |
| *B81C 1/00* | (2006.01) |
| *H04R 19/00* | (2006.01) |
| *H04R 19/04* | (2006.01) |
| *H04R 31/00* | (2006.01) |
| *G01P 15/08* | (2006.01) |
| *G01P 15/125* | (2006.01) |

(52) U.S. Cl.
CPC ........... *B81B 3/0021* (2013.01); *B81C 1/00301* (2013.01); *H04R 19/005* (2013.01); *H04R 19/04* (2013.01); *H04R 31/00* (2013.01); *G01P 15/0802* (2013.01); *G01P 15/125* (2013.01); *B81B 2201/0235* (2013.01); *B81B 2207/098* (2013.01)
USPC ......................................................... 257/415

(58) Field of Classification Search
CPC .. B81B 3/0018; B81B 3/0021; B81B 7/0006; B81B 7/0032; B81B 2201/0235; B81B 2207/098; B81C 1/00134; B81C 1/00158; B81C 1/00301; G01P 15/0802; G01P 15/125; H04R 19/04; H04R 19/05
USPC ......................................... 257/415, 416, 532
See application file for complete search history.

(56) References Cited

U.S. PATENT DOCUMENTS

| | | | |
|---|---|---|---|
| 6,770,504 B2 * | 8/2004 | Horning et al. | ................. 438/48 |
| 6,809,412 B1 * | 10/2004 | Tourino et al. | ................ 257/678 |

(Continued)

OTHER PUBLICATIONS

So et al., "Benzocyclobutene-based polymers for microelectronics," 2001, Chemical Innovation, vol. 31, No. 12, pp. 40-47, Dec. 2001.

*Primary Examiner* — Nikolay Yushin
(74) *Attorney, Agent, or Firm* — Slater & Matsil, L.L.P.

(57) ABSTRACT

A method includes forming a Micro-Electro-Mechanical System (MEMS) device on a front surface of a substrate. After the step of forming the MEMS device, a through-opening is formed in the substrate, wherein the through-opening is formed from a backside of the substrate. The through-opening is filled with a dielectric material, which insulates a first portion of the substrate from a second portion of the substrate. An electrical connection is formed on the backside of the substrate. The electrical connection is electrically coupled to the MEMS device through the first portion of the substrate.

20 Claims, 17 Drawing Sheets

(56) References Cited

U.S. PATENT DOCUMENTS

| | | |
|---|---|---|
| 2006/0075818 A1 | 4/2006 | Huang et al. |
| 2008/0048211 A1 | 2/2008 | Khuri-Yakub et al. |
| 2010/0244161 A1 | 9/2010 | Tabrizi |

* cited by examiner

MEMS DEVICES

This application is a divisional of U.S. patent application Ser. No. 13/310,422, entitled "MEMS Devices and Methods for Forming the Same," filed on Dec. 2, 2011, which application is incorporated herein by reference.

BACKGROUND

Micro-Electro-Mechanical System (MEMS) devices may be used in various applications such as micro-phones, accelerometers, inkjet printers, etc. A commonly used type of MEMS devices utilizes a movable element (sometimes referred to as a proof mass) as a capacitor plate, and a fixed element as the other capacitor plate. The movement of the movable element causes the change in the capacitance of the capacitor. The change in the capacitance may be converted into the change in an electrical signal, and hence the MEMS device may be used as a microphone, an accelerometer, or the like. The movement of the movable element may also be used for squeezing the ink in an inkjet printer.

For most applications, MEMS devices are electrically connected to Application Specific Integrated Circuits (ASICs) to form a complete system. The connections may be made through wire bonding, which requires extra chip areas. The connections may also be made through the substrate, wherein portions of the conductive substrate may be isolated by dielectric materials to form the connections. Complicate process steps are involved in the formation of the dielectric materials that insolate the substrate portions.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A Micro-Electro-Mechanical System (MEMS) device and the method of forming the same are provided in accordance with various embodiments. The intermediate stages of forming the MEMS device are illustrated. The variations and the operation of the embodiments are discussed. Throughout the various views and illustrative embodiments, like reference numbers are used to designate like elements.

Figure 1:
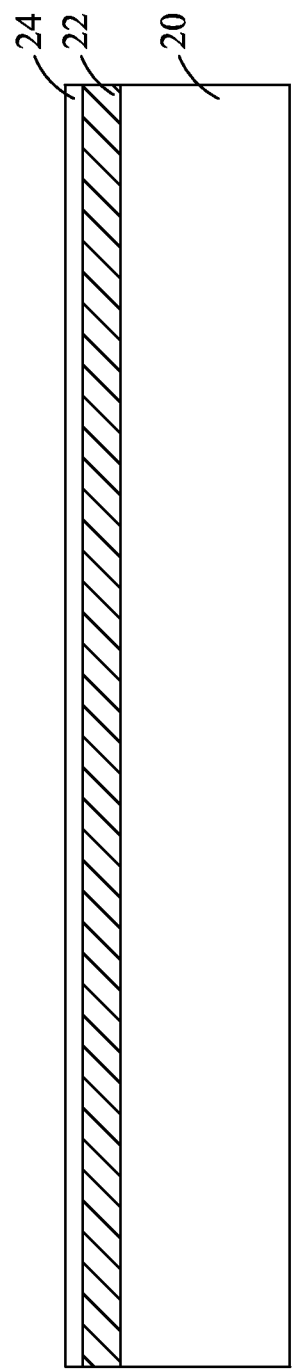
FIGS. 1 through 16 are cross-sectional views of intermediate stages in the manufacturing of a MEMS device in accordance with various embodiments.

FIGS. 1 through 16 illustrate cross-sectional views and top views of the intermediate stages in the formation of MEMS devices in accordance with various exemplary embodiments. Referring to FIG. 1, substrate 20, which is conductive, is provided. Substrate 20 may comprise a semiconductor material such as silicon, although other semiconductor materials may be used. When formed of a semiconductor material, substrate 20 may be heavily doped with a p-type or an n-type impurity, for example, to an impurity concentration higher than about $10^{20}/cm^3$. Accordingly, substrate 20 has a low resistivity, and may be used for the electrical connection purpose. Dielectric layer 22 is formed on the top surface of substrate 20. In an embodiment, dielectric layer 22 comprises silicon oxide, which may be formed by thermally oxidizing a surface layer of substrate 20. Accordingly, throughout the description, dielectric layer 22 is alternatively referred to as oxide layer 22, although different dielectric materials may be used to form dielectric layer 22. The thickness of dielectric layer 22 may be greater than about 1 μm, or between about 1 μm and about 5 μm. It is realized, however, that the dimensions recited throughout the description are merely examples, and may be changed to different values.

Low-stress nitride layer 24 may be deposited on dielectric layer 22. The thickness of low-stress nitride layer 24 may between about 1 kÅ and about 10 kÅ, for example. The deposition methods include Chemical Vapor Deposition (CVD) methods such as Low-Pressure CVD (LPCVD).

Figure 2:
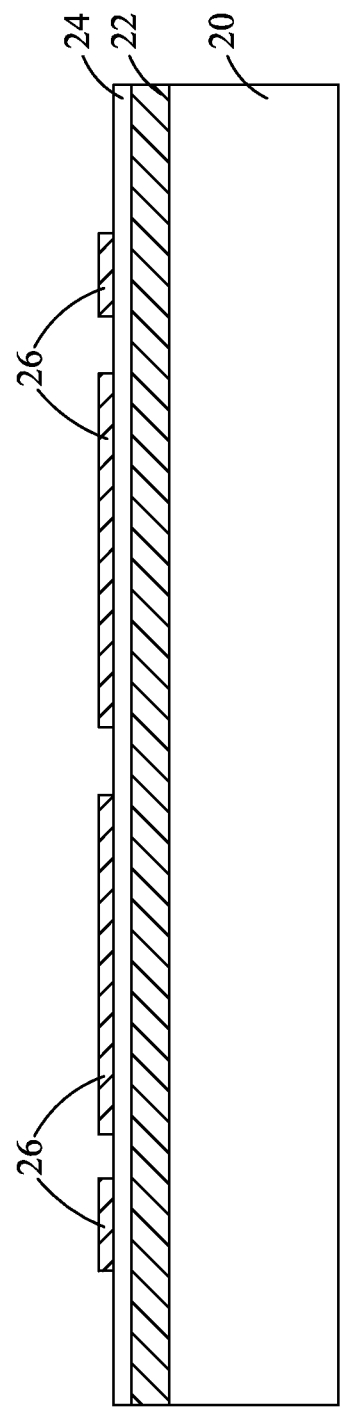

Referring to FIG. 2, conductive layer 26 is deposited, and is then patterned. In some embodiments, conductive layer 26 comprises polysilicon, although other conductive materials such as metals (for example, aluminum copper), may be used. The polysilicon in conductive layer 26 may be doped with a p-type or an n-type impurity to increase its conductivity.

Figure 3:
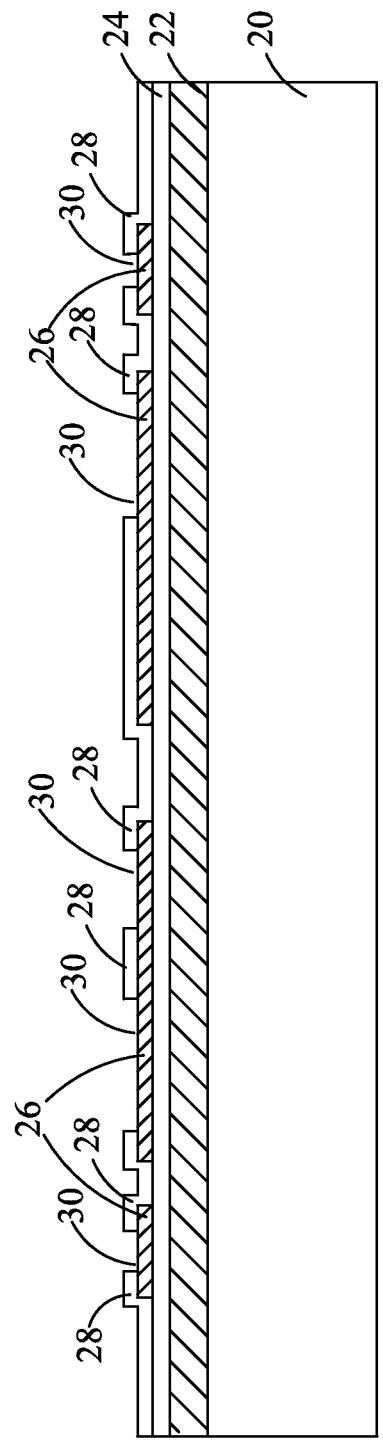

FIG. 3 illustrates the deposition and the patterning of sacrificial layer 28, which is formed over conductive layer 26. The pattern of sacrificial layer 28 is designed to fit the patterns of the components of the subsequently formed MEMS device 40 (please refer to FIG. 7). The thickness of sacrificial layer 28 may be between about 0.2 kÅ and about 100 kÅ, for example. The material of sacrificial layer 28 may be selected so that there is a high etching selectivity between sacrificial layer 28 and conductive layer 26. Accordingly, in subsequent steps, sacrificial layer 28 may be etched without the substantial etching of conductive layer 26. Furthermore, there is a high etching selectivity between sacrificial layer 28 and low-stress nitride layer 24. In an embodiment, sacrificial layer 28 comprises silicon oxide. The patterned sacrificial layer 28 may cover edge portions of the patterned conductive layer 26, while some middle portions of the patterned conductive layer 26 are exposed through openings 30 in sacrificial layer 28.

Figure 4:
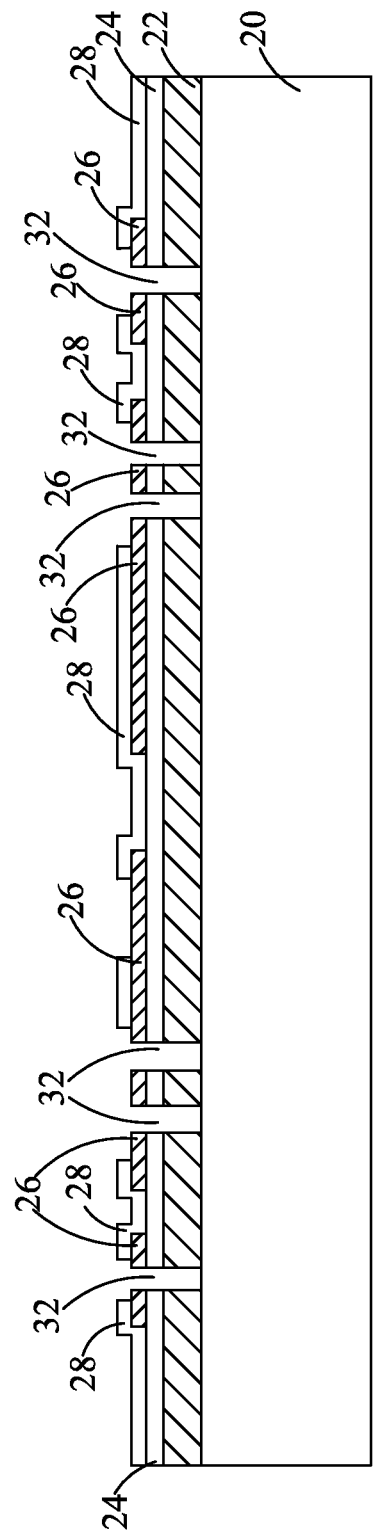

Next, as shown in FIG. 4, contact via openings 32 are formed by etching through some of the exposed portions of conductive layer 26. In the meantime, some exposed portions of conductive layer 26 may, or may not, be left un-etched. Low-stress nitride layer 24 and dielectric layer 22 are also etched. Accordingly, contact via openings 32 further extend into low-stress nitride layer 24 and dielectric layer 22. Substrate 20 is thus exposed through contact via openings 32.

Figure 5:
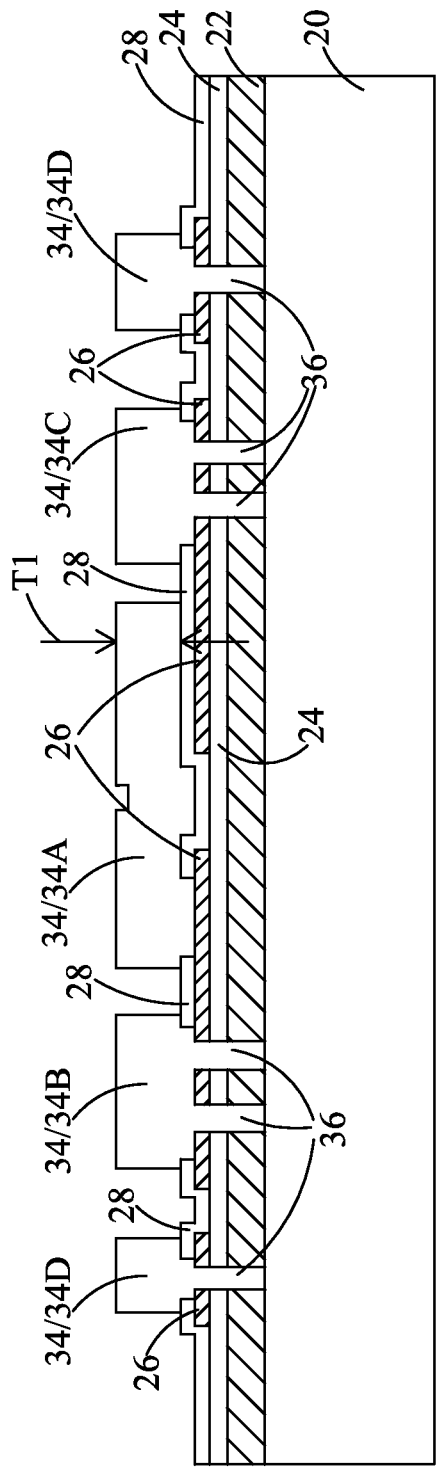

FIG. 5 illustrates the deposition and the patterning of a conductive material, so that conductive patterns 34 (including 34A, 34B, 34C, and 34D) are formed. The conductive material is filled into contact via openings 32 (illustrated in FIG. 4) to form contact plugs 36, which electrically couple conductive patterns 34 to substrate 20. In some embodiments, the conductive material comprises polysilicon. Thickness T1 of the portions of conductive patterns 34 may be greater than about 1 μm, and may be between about 1 μm and about 5 μm, for example.

Figure 6:
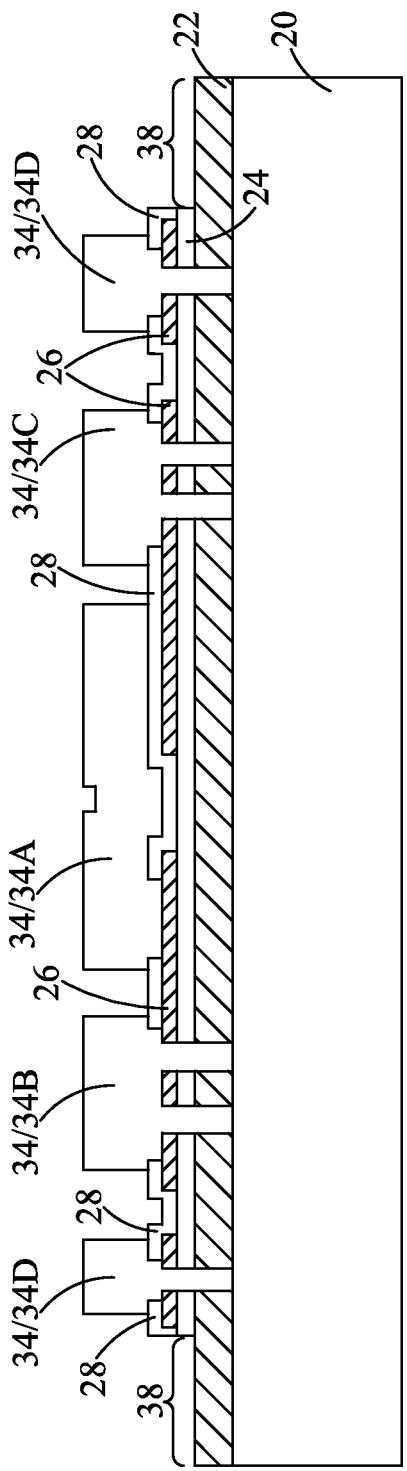

In FIG. 6, portions of sacrificial layer 28 and low-stress nitride layer 24 are removed to define fusion bonding area 38. In fusion bonding area 38, the top surface of oxide layer 22 is exposed. The exposed portions of oxide layer 22 may form a ring in a top view of FIG. 6, wherein the ring encircles conductive patterns 34.

Figure 7:
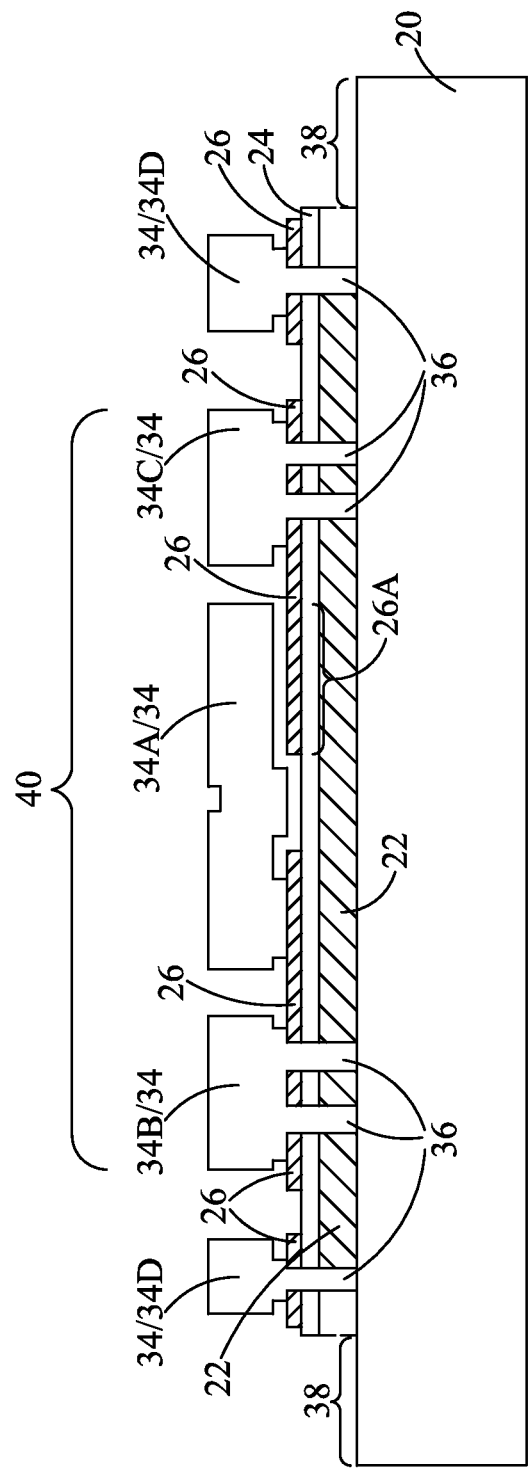

FIG. 7 illustrates the removal of sacrificial layer 28. In an embodiment, sacrificial layer 28 is formed of silicon oxide, and hence may be etched using vapor HF. Alternatively, a HF solution is used to etch sacrificial layer 28, followed by a drying process. Dielectric layer 22, which may also be formed of silicon oxide, is also etched. As a result, in the fusion bonding area 38, the exposed portions of dielectric layer 22 are removed. Low-stress nitride layer 24 may protect some portions of dielectric 22 from being etched. In some embodiments, conductive patterns 34D may form a full ring, so that the portion of dielectric layer 22 encircled by ring 34D is protected from being etched. After the removal of sacrificial layer 28, conductive pattern 34A may be spaced apart from the underlying portion 26A of conductive layer 26. Accordingly, conductive pattern 34A and portion 26A of conductive layer 26 form two capacitor plates of a capacitor, which is a part of MEMS device 40. In addition, the capacitance between conductive patterns 34A and 34C may also form a capacitor of MEMS device. Due to the existence of the space between conductive pattern 34A and portion 26A of conductive layer 26, conductive pattern 34A is movable. Conductive pattern 34A is alternatively referred to as a proof mass or a movable element.

Figure 8:
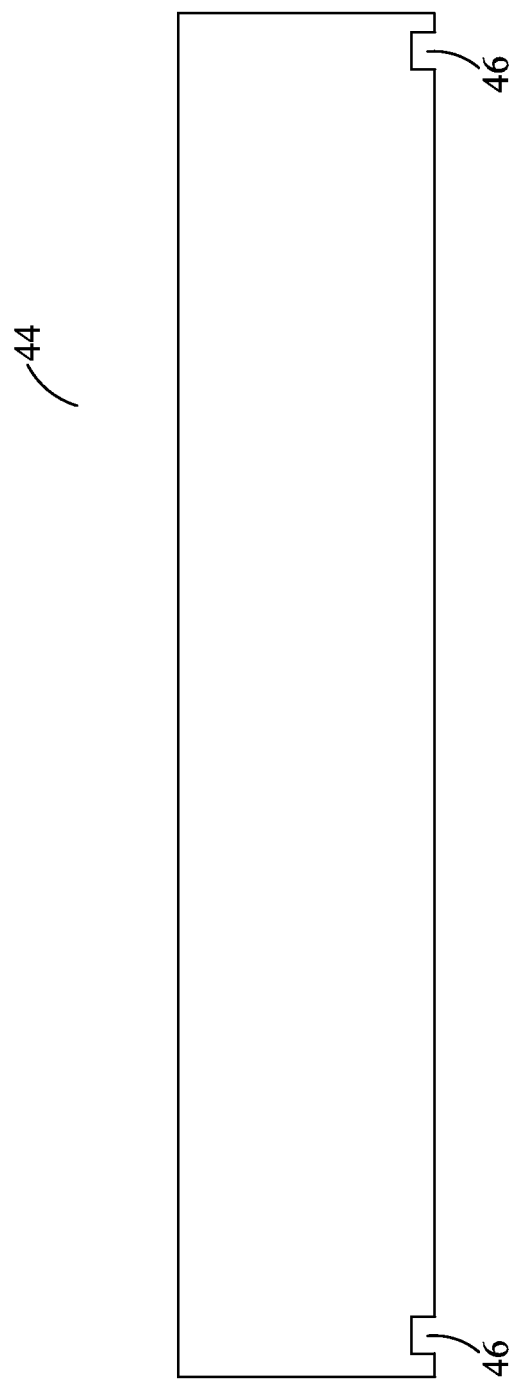
Figure 9:
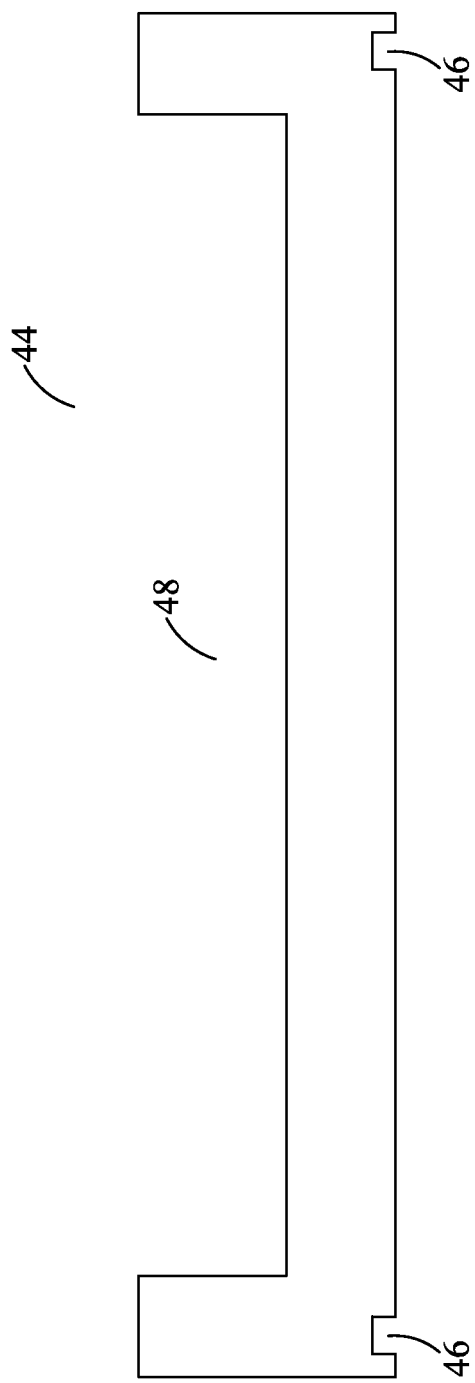
Figure 10:
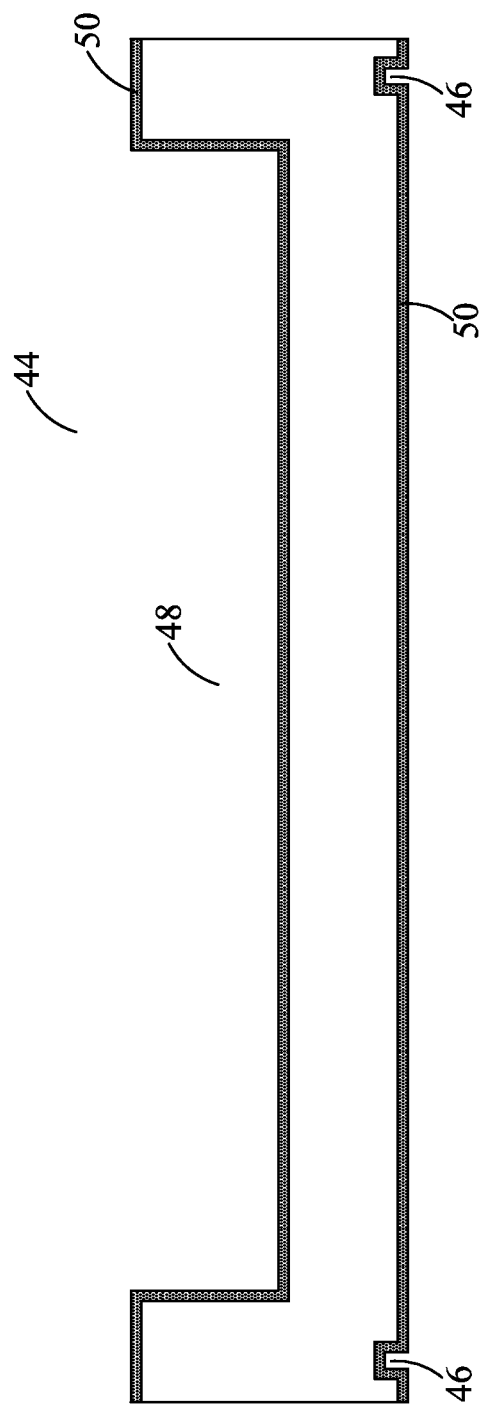

FIGS. 8 through 10 illustrate the process for preparing a cap. Referring to FIG. 8, cap wafer 44 is provided. Cap wafer 44 may be a silicon wafer, for example. Alignment marks 46 may be formed on the bottom side of cap wafer 44. Next, as shown in FIG. 9, a Deep Reactive-Ion Etching (DRIE) process is performed to form recess 48 in cap wafer 44. As shown in FIG. 10, dielectric layers 50 may be formed on the top surface and the bottom surface of cap wafer 44. Dielectric layer 50 that is formed on the top surface of cap wafer 44 may extend into recess 48. In an exemplary embodiment, dielectric layers 50 may be thermal oxide layers formed by performing a thermal oxidation on cap wafer 44. Accordingly, dielectric layers 50 are referred to as oxide layers 50 hereinafter.

Figure 11:
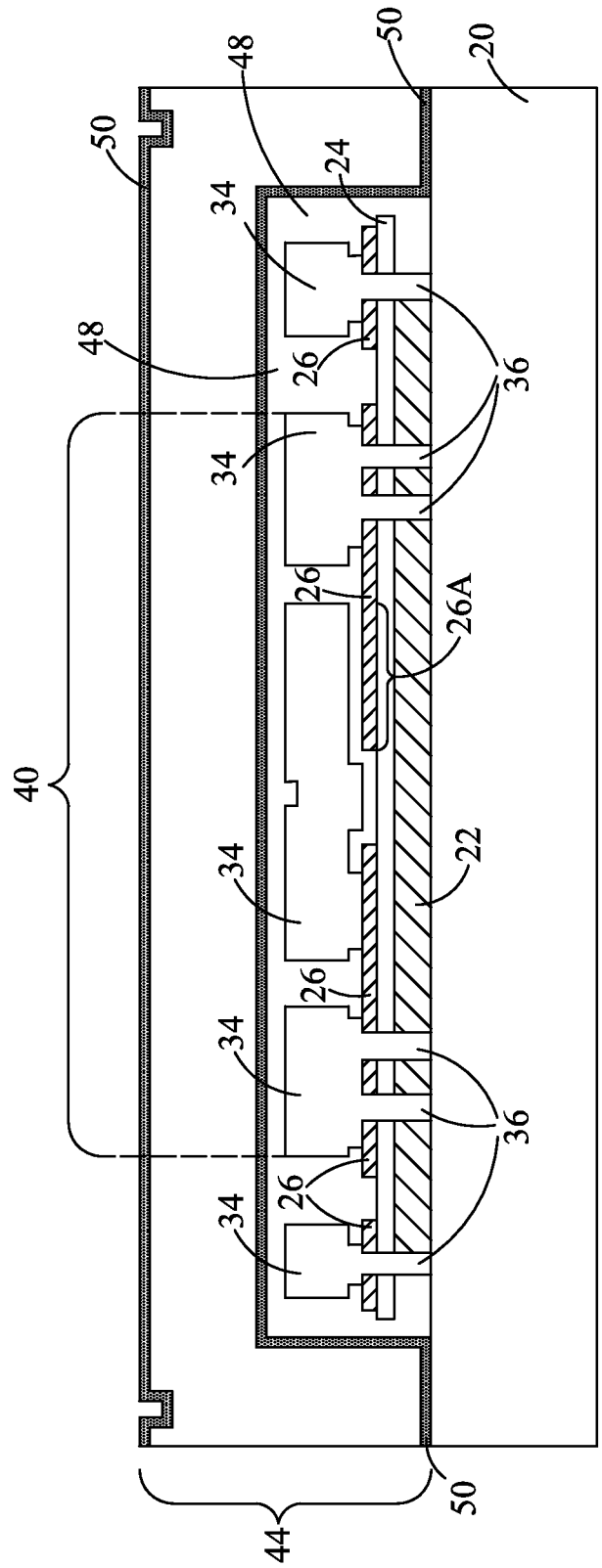

Referring to FIG. 11, cap wafer 44 is bonded to the structure shown in FIG. 7. MEMS device 40 is thus covered by cap wafer 44, and may extend into recess 48 of cap wafer 44. Portions of oxide layer 50 are bonded to the top surface of substrate 20. The portions of oxide layer 50 that are bonded to substrate 20 may form a close-loop ring in the top view of FIG. 11. The bonding may be a fusion bonding, wherein according to some exemplary embodiments, the temperatures of cap wafer 44 and substrate 20 are kept at room temperature, and a pressure is applied to press cap wafer 44 against substrate 20. The bonded wafer is then subject to a high temperature annealing. As a result of the high temperature and/or the pressure, oxide layer 50 forms bonds with substrate 20. The fusion bonding may be performed in a vacuum environment. Accordingly, during the bonding process, the space (recess 48) inside cap wafer 44 is vacuumed, which vacuum may be maintained after the structure as in FIG. 11 is taken out of the vacuum environment.

Figure 12:
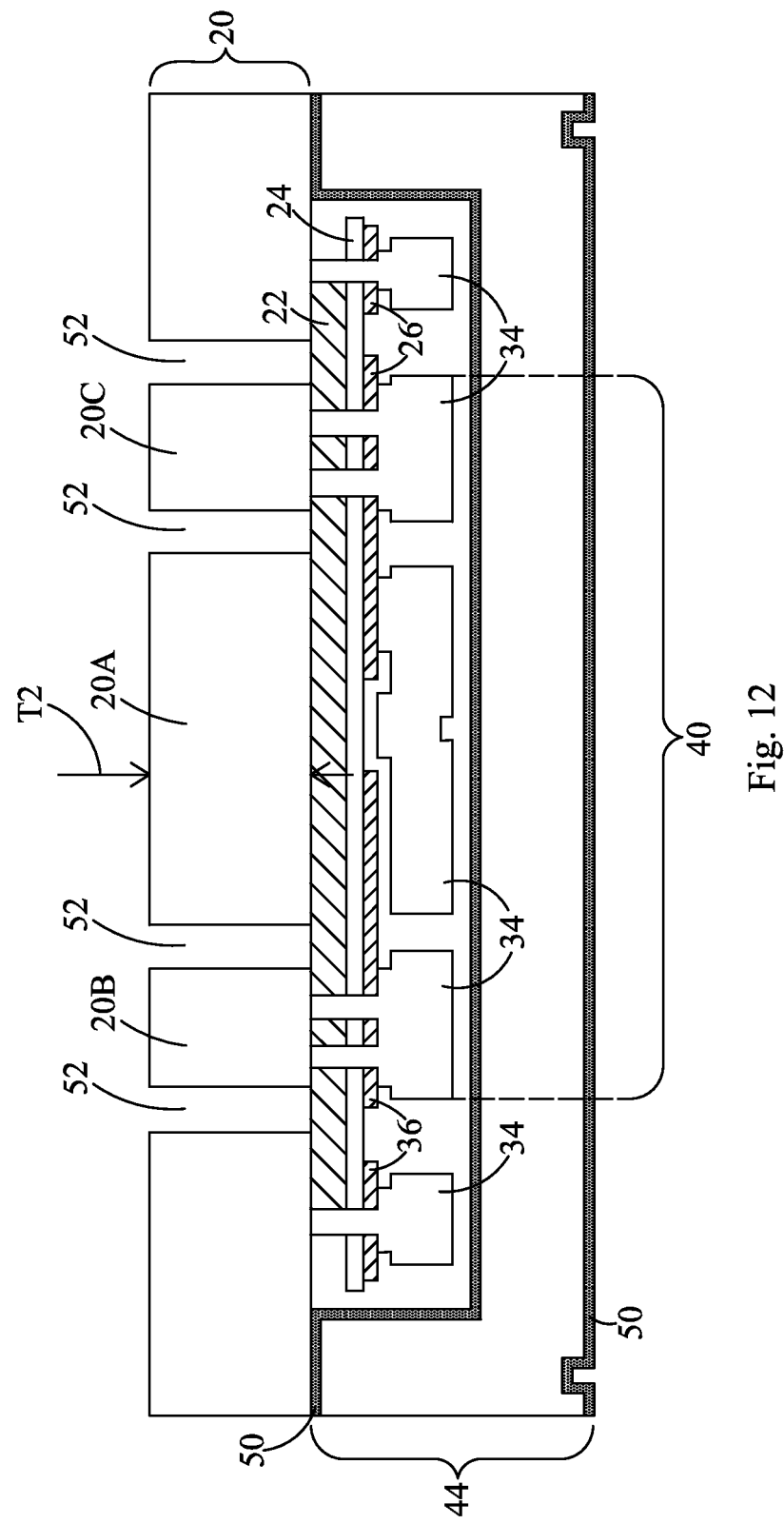

In FIG. 12, the structure in FIG. 11 is flipped upside down, and a backside grinding is performed on the back surface of substrate 20. The backside grinding is performed until thickness T2 of substrate 20 is smaller than a pre-determined thickness, for example, less than about 200 μm, or less than about 150 μm. An etch step is then performed to etch through substrate 20 to form through-openings 52. The etch step may be performed using DRIE, for example. Through-openings 52 may physically and electrically isolate some portions of substrate 20 from other portions. For example, in the illustrative FIG. 12, substrate portions 20A, 20B, and 20C may be disconnected from each other, and disconnected from other portions of substrate 20.

Figure 13:
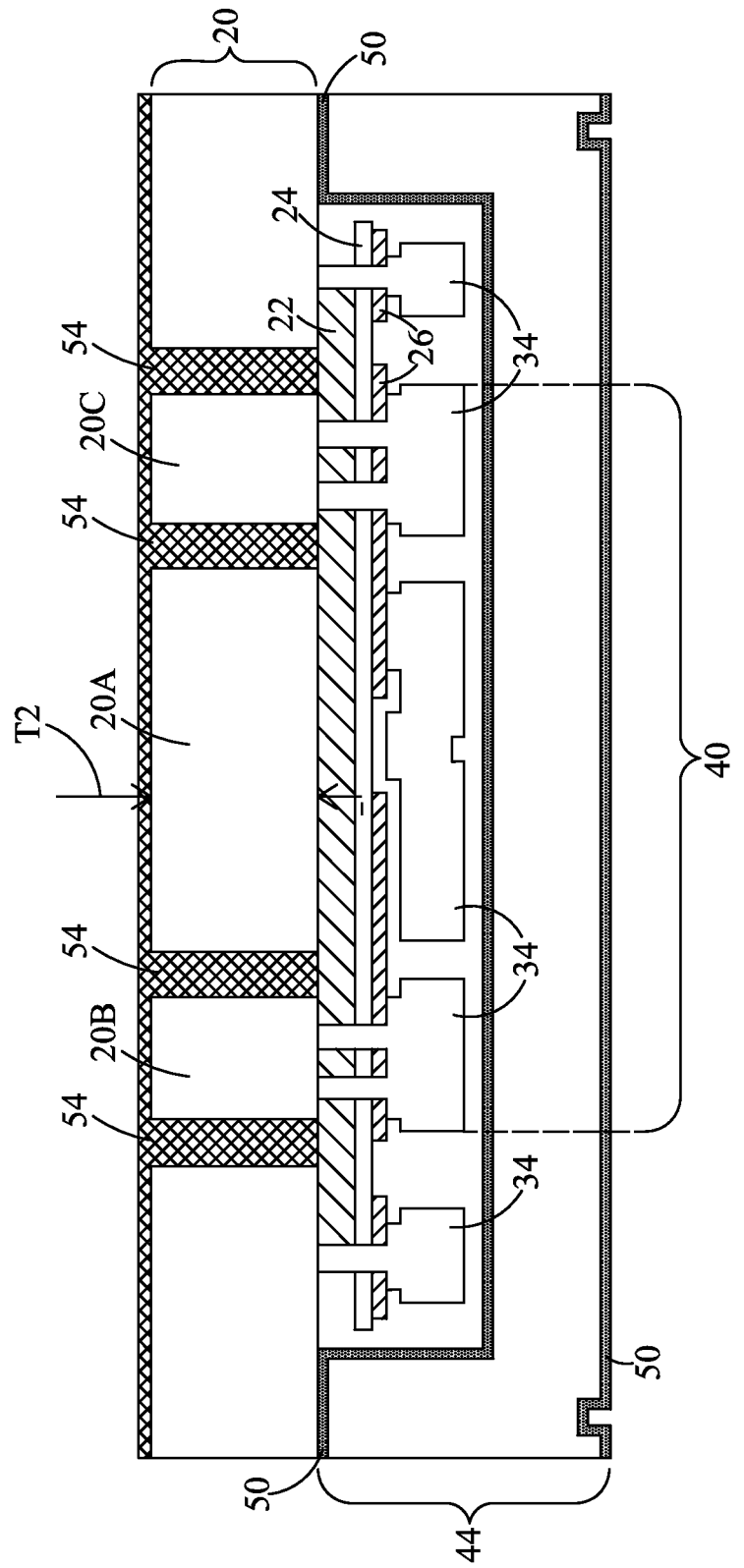

FIG. 13 illustrates the filling of through-openings 52 with dielectric material 54. In an exemplary embodiment, dielectric material 54 also covers the back surface of substrate 20. Dielectric material 54 may comprise a polymer such as an epoxy in some embodiments. Furthermore, dielectric material 54 may comprise a photosensitive material such as a photosensitive epoxy. In an embodiment, the photosensitive epoxy comprises SU8, which is a negative photosensitive epoxy. In alternative embodiments, dielectric material 54 may comprise bisbenzocyclobutene (BCB). Dielectric material 54 may be filled into through-openings 52 through spin-coating, and may then be cured, for example, using a thermal curing process, an Ultra-Violet (UV) curing process, or the like. Alternatively, dielectric material 54 may comprise a dry film, which is laminated on the top surface of substrate 20 and extends into through-openings 52.

Through-openings 52 (FIG. 12) may be filled in a single filling step such as spin-on coating. The portions of dielectric material 54 in substrate 20 may be a homogenous material that does not comprise multiple regions formed of different materials. Rather, entireties of through-openings 52 are filled with a single homogenous material.

Dielectric material 54 (such as BCB and SU8) may also be a low-temperature material that cannot endure (and will be damaged by) high temperatures higher than about 150° C. Since dielectric material 54 is filled after the formation of layers 22, 24, 26, 28, and 34, the high temperature (which may be higher than about 550° C.) used in the formation of layers 22, 24, 26, 28, and/or 34 will not cause the damage to dielectric material 54. Accordingly, the low-temperature material may be used to replace silicon oxide and silicon nitride for filling through-openings 52 as in FIG. 12, and through-openings 52 may be filled easier than using CVD methods.

Figure 14A:
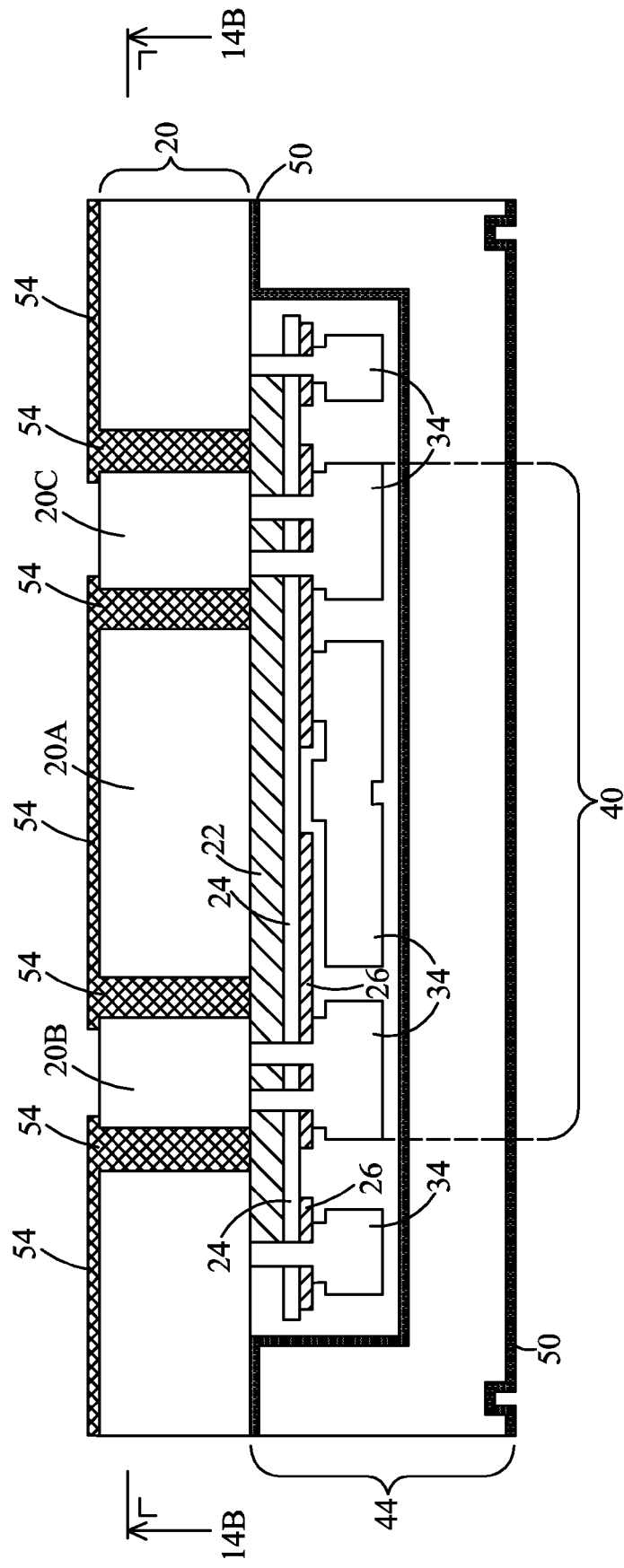
Figure 14B:
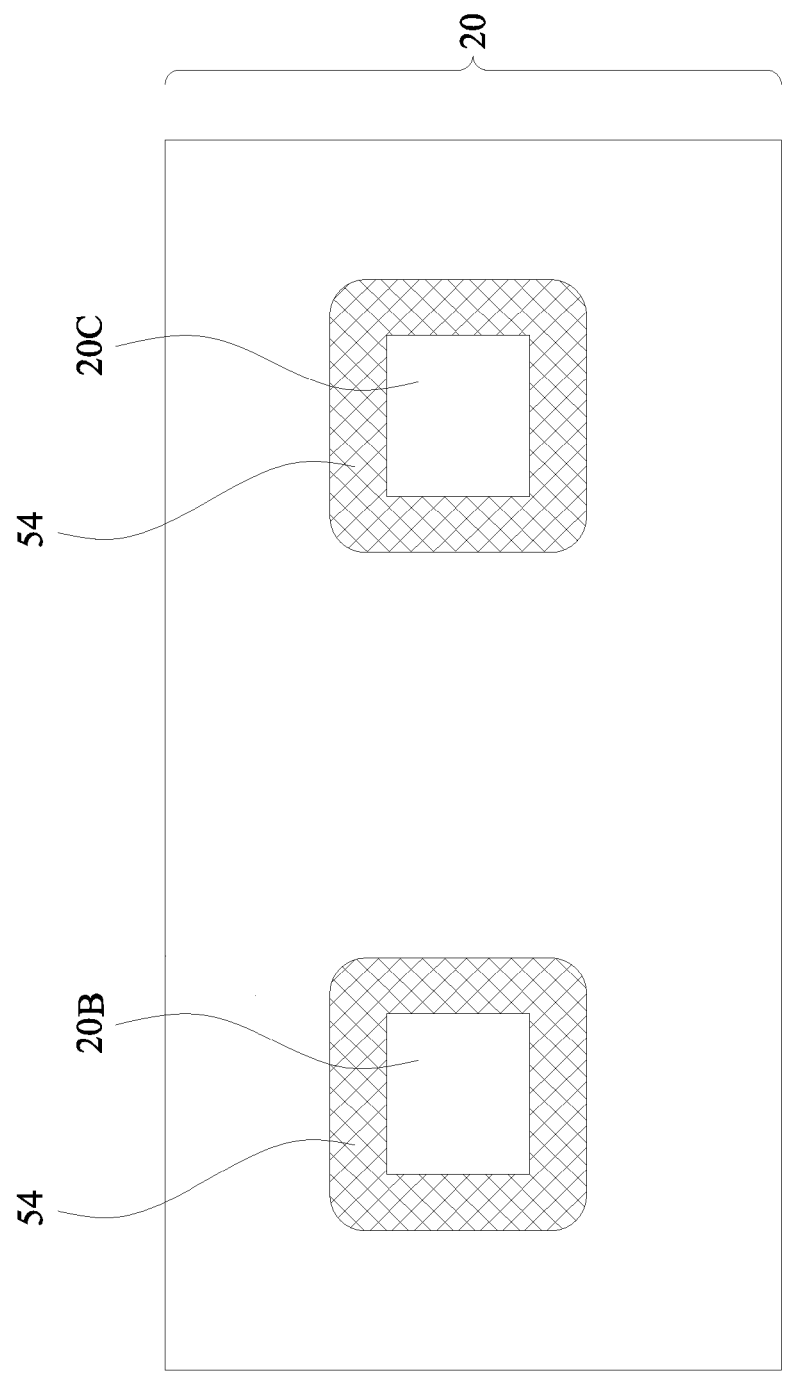

Referring to FIG. 14A, the portions of dielectric material 54 that are on the top surface of substrate 20 are patterned. Since dielectric material 54 may be photosensitive, the patterning does not require additional photoresists. Substrate portions 20B and 20C of substrate 20 are thus exposed. FIG. 14B illustrates a top view of substrate 20, wherein the cross-sectional view is obtained from the plane crossing line 14B-14B in FIG. 14A. As shown in FIG. 14B, dielectric material 54 may form rings encircling substrate portion 20B and substrate portion 20C. Substrate portions 20B and 20C are insulated from each other by dielectric material 54. Furthermore, substrate portions 20B and 20C are insulated from portions of substrate 20 that are outside of the rings. It is appreciated that although the top-view shapes of substrate portions 20B and 20C are rectangles, substrate portions 20B and 20C may also have other top-view shapes such as circles, hexagons, octagons, or the like.

Figure 15:
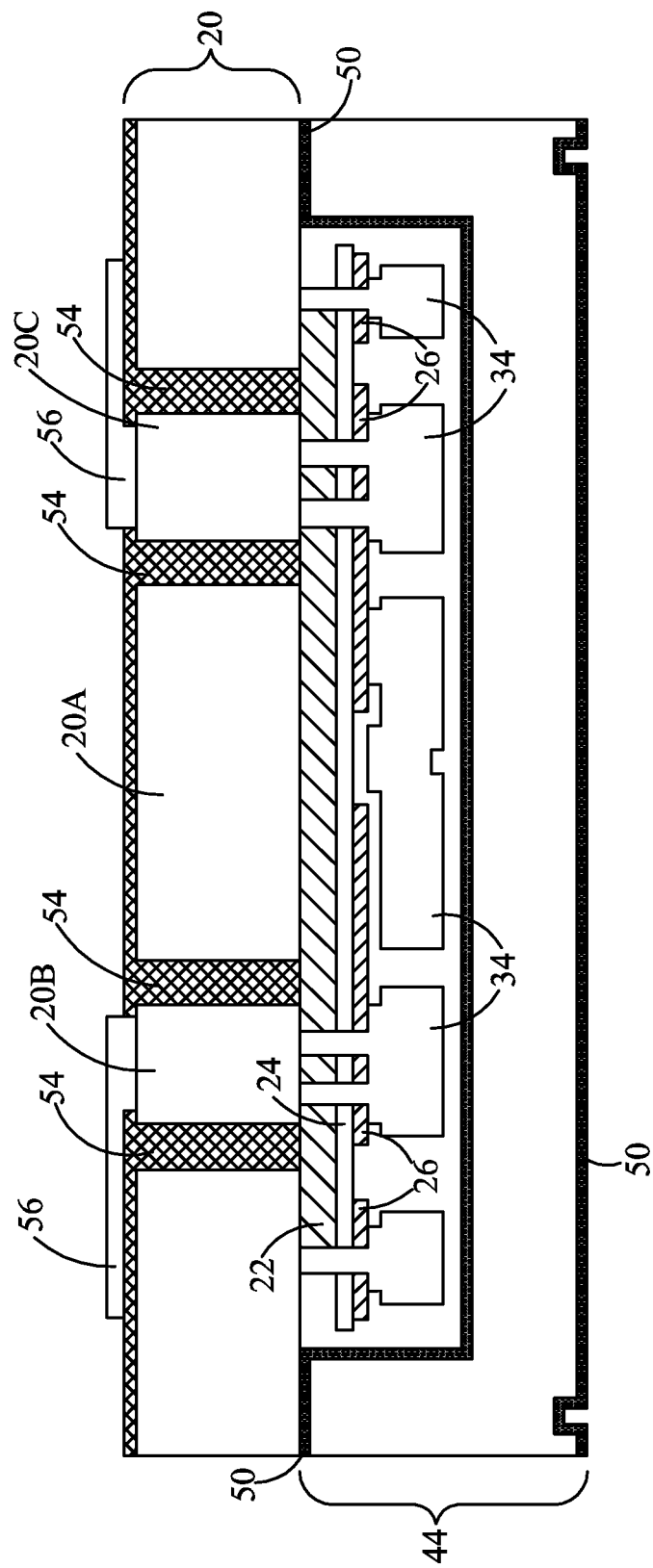

Next, as shown in FIG. 15, electrical connections 56 are formed on the backside of substrate 20 and over dielectric material 54. Electrical connections may further extend into dielectric material 54 to electrically connect to substrate portions 20B and 20C. In some embodiments, electrical connections 56 comprise metal traces, which may be formed of copper, aluminum copper, or the like. Electrical connections 56 may also comprise solder balls, metal pillars, solder caps formed on metal pillars, and/or the like.

Figure 16:
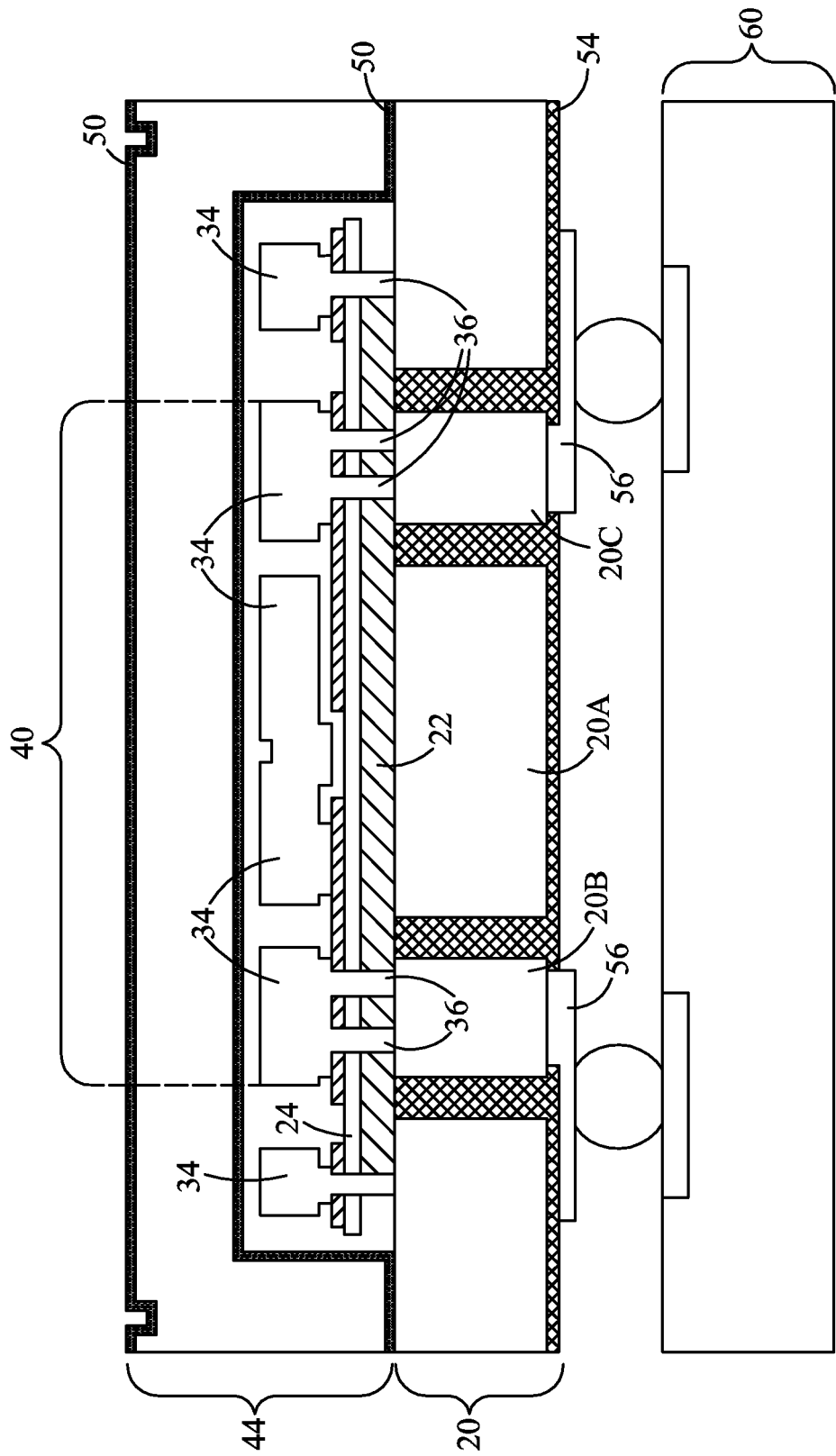

FIG. 16 illustrates a package comprising MEMS device 40, substrate 20, cap wafer 44, and package component 60. It is noted that the structure shown in FIG. 16 is merely an example for illustrating the package including MEMS device 40. There are various methods and structures for packaging MEMS device 40. In this example, electrical connections 56 are bonded to, and electrically coupled to, package component 60, which may be a device die comprising transistors (not shown) therein, an interposer, a package substrate, a Printed Circuit Board (PCB), or the like.

In the structures shown in FIGS. 15 and 16, electrical connections 56 are electrically coupled to the capacitor plates of MEMS device 40 through substrate portions 20B and 20C. Substrate portions 20B and 20C thus act as electrical connections that penetrate through substrate 20. It is observed that substrate portions 20B and 20C are electrically insulated from each other, and are electrically insulated from other portions of substrate 20 by dielectric material 54.

In the embodiments, via-last approaches are used to form connections 20B and 20C (FIG. 6) that penetrate through substrate 20, wherein the via-last approaches means that dielectric material 54 (FIGS. 14A and 14B) are formed after the formation of MEMS device 40. Accordingly, the filling of the through-openings in substrate 20 with the dielectric material is performed after the high-temperature processes, such as the formation processes of layers 22, 24, 26, 28, and 34 (FIGS. 1 through 7). As a result, low-temperature materials may be used to fill into substrate 20 in order to insulate connections 20B and 20C. The low-temperature materials will not be damaged since the high-temperature processes have already been finished. The low-temperature materials may easily fill deep and wide through-openings in the substrate 20. Therefore, in the embodiments, there is no need to use CVD methods to fill the openings in substrate 20. The throughput is increased since the filling rate of the low-temperature materials in substrate 20 is significantly higher than the rate of filling using CVD methods.

In accordance with embodiments, a method includes forming a MEMS device on a front surface of a substrate. After the step of forming the MEMS device, a through-opening is formed in the substrate, wherein the through-opening is formed from a backside of the substrate. The through-opening is filled with a dielectric material, which insulates a portion of the substrate from remaining portions of the substrate. An electrical connection is formed on the backside of the substrate. The electrical connection is electrically coupled to the MEMS device through the portion of the substrate.

In accordance with other embodiments, a method includes forming a MEMS device on a front surface of a substrate, wherein the step of forming the MEMS device comprises a high-temperature process performed at a high temperature. A through-opening is formed in the substrate, wherein the through-opening is formed from a backside of the substrate. The through-opening is filled with a dielectric material, wherein the dielectric material electrically insulates a portion of the substrate from remaining portions of the substrate. The dielectric material is a low-temperature material damageable at the high temperature. An electrical connection is formed on the backside of the substrate, wherein the electrical connection is electrically coupled to the MEMS device through the portion of the substrate.

In accordance with yet other embodiments, a device includes a substrate, a MEMS device on a front surface of the substrate, and a dielectric material penetrating through the substrate. The dielectric material forms a ring, and an entirety of the ring is formed of a homogeneous material. The ring separates the substrate into a first portion encircled by the ring, and a second portion outside the ring, wherein the first portion is electrically insulated from the second portion. An electrical connection is disposed on the backside of the substrate, wherein the electrical connection is electrically coupled to the MEMS device through the first portion of the substrate.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   a substrate;
   a Micro-Electro-Mechanical System (MEMS) device on a front surface of the substrate;
   a dielectric material penetrating through the substrate, wherein the dielectric material forms a ring, wherein an entirety of the ring is formed of a homogeneous material, and wherein the ring separates the substrate into:
      a first portion encircled by the ring; and
      a second portion outside of the ring, wherein the first portion is electrically insulated from the second portion; and
   an electrical connection on a backside of the substrate, wherein the electrical connection is electrically coupled to the MEMS device through the first portion of the substrate.

2. The device of claim 1, wherein the MEMS device comprises a capacitor, and wherein the electrical connection is electrically connected to a capacitor plate of the capacitor.

3. The device of claim 1, wherein the dielectric material extends to contact a back surface of the substrate.

4. The device of claim 1, wherein the dielectric material comprises a photosensitive material.

5. The device of claim 1, wherein the substrate comprises a silicon substrate doped with a p-type impurity.

6. The device of claim 1, wherein the substrate comprises a silicon substrate doped with an n-type impurity.

7. The device of claim 1 further comprising:
   an oxide on the front surface of the substrate; and
   a contact plug penetrating through the oxide and electrically coupling the first portion of the substrate to the MEMS device.

8. A device comprising:
   a semiconductor substrate;
   a Micro-Electro-Mechanical System (MEMS) device on a first side of the semiconductor substrate, wherein the MEMS device comprises a capacitor, and wherein the capacitor comprises a first capacitor plate and a second capacitor plate; and
   a first conductive trace on a second side of the semiconductor substrate, wherein the first side and the second side are opposite sides of the semiconductor substrate, and wherein the first conductive trace is electrically connected to the first capacitor plate through a first portion of the semiconductor substrate.

9. The device of claim 8, wherein the semiconductor substrate further comprises a second portion encircling the first portion of the semiconductor substrate, wherein the first portion and the second portion of the semiconductor substrate are formed of an identical semiconductor material.

10. The device of claim 9, wherein the first portion and the second portion have first surfaces coplanar with each other, and second surfaces coplanar with each other, with the first surfaces and the second surfaces being opposite surfaces of the semiconductor substrate.

11. The device of claim 8 further comprising a dielectric ring encircling the first portion of the semiconductor substrate.

12. The device of claim 11, wherein the dielectric ring comprises a polymer.

13. The device of claim 11, wherein the dielectric ring comprises a photo sensitive epoxy.

14. The device of claim 11, wherein the dielectric ring comprises bisbenzocyclobutene (BCB).

15. The device of claim 8, wherein the first capacitor plate comprises a proof mass of the MEMS device.

16. The device of claim 8 further comprising a second conductive trace on the second side of the semiconductor substrate, wherein the second conductive trace is electrically connected to the second capacitor plate through a second portion of the semiconductor substrate.

17. A device comprising:
a silicon substrate;
a Micro-Electro-Mechanical System (MEMS) device on a first side of the silicon substrate;
a dielectric material penetrating through the silicon substrate, wherein the dielectric material forms a ring, and wherein the ring separates the silicon substrate into:
a first portion encircled by the ring; and
a second portion outside of the ring, wherein the first portion is electrically insulated from the second portion, and wherein the first portion and the second portion comprise silicon regions; and
an electrical connection on a second side of the silicon substrate, wherein the electrical connection is electrically coupled to the MEMS device through the first portion of the silicon substrate.

18. The device of claim 17, wherein an entirety of the ring is formed of a homogeneous material.

19. The device of claim 17, wherein the dielectric material comprises a photo sensitive polymer.

20. The device of claim 17, wherein the MEMS device comprises a proof mass, and wherein the electrical connection is electrically connected to the proof mass.

* * * * *